(12) United States Patent
Honma

(10) Patent No.: US 9,640,265 B1
(45) Date of Patent: May 2, 2017

(54) SEMICONDUCTOR MEMORY DEVICE

(71) Applicant: KABUSHIKI KAISHA TOSHIBA, Minato-ku, Tokyo (JP)

(72) Inventor: Mitsuaki Honma, Fujisawa Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/261,647

(22) Filed: Sep. 9, 2016

(30) Foreign Application Priority Data

Mar. 14, 2016 (JP) .................................. 2016-049720

(51) Int. Cl.
*G11C 16/04* (2006.01)
*G11C 16/12* (2006.01)
*G11C 16/34* (2006.01)
*G11C 11/56* (2006.01)

(52) U.S. Cl.
CPC .......... *G11C 16/12* (2013.01); *G11C 11/5628* (2013.01); *G11C 16/3459* (2013.01)

(58) Field of Classification Search
USPC .......................... 365/185.22, 185.19, 185.28
See application file for complete search history.

(56) References Cited

U.S. PATENT DOCUMENTS

| | | |
|---|---|---|
| 2009/0055577 A1* | 2/2009 | Moon .................... G11C 16/10 711/103 |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2014/0056074 A1* | 2/2014 | Kim ....................... G11C 16/06 365/185.12 |
| 2014/0340964 A1 | 11/2014 | Shino et al. |

* cited by examiner

*Primary Examiner* — Vu Le
(74) *Attorney, Agent, or Firm* — Holtz, Holtz & Volek PC

(57) ABSTRACT

According to one embodiment, the semiconductor memory device includes a first memory cell and a word line. The first memory cell is capable of storing two or more bits of data. The word line is coupled with the first memory cell. a write operation repeat a program loop. The program loop includes a program operation and a verification operation. A program voltage is applied to the word line in the program operation. The write operation includes a first program loop and a second program loop subsequent to the first program loop. Program voltage is applied a first number of times in the first program loop. Program voltage is applied a second number of times in the second program loop. The second number of times is larger than the first number of times.

20 Claims, 13 Drawing Sheets

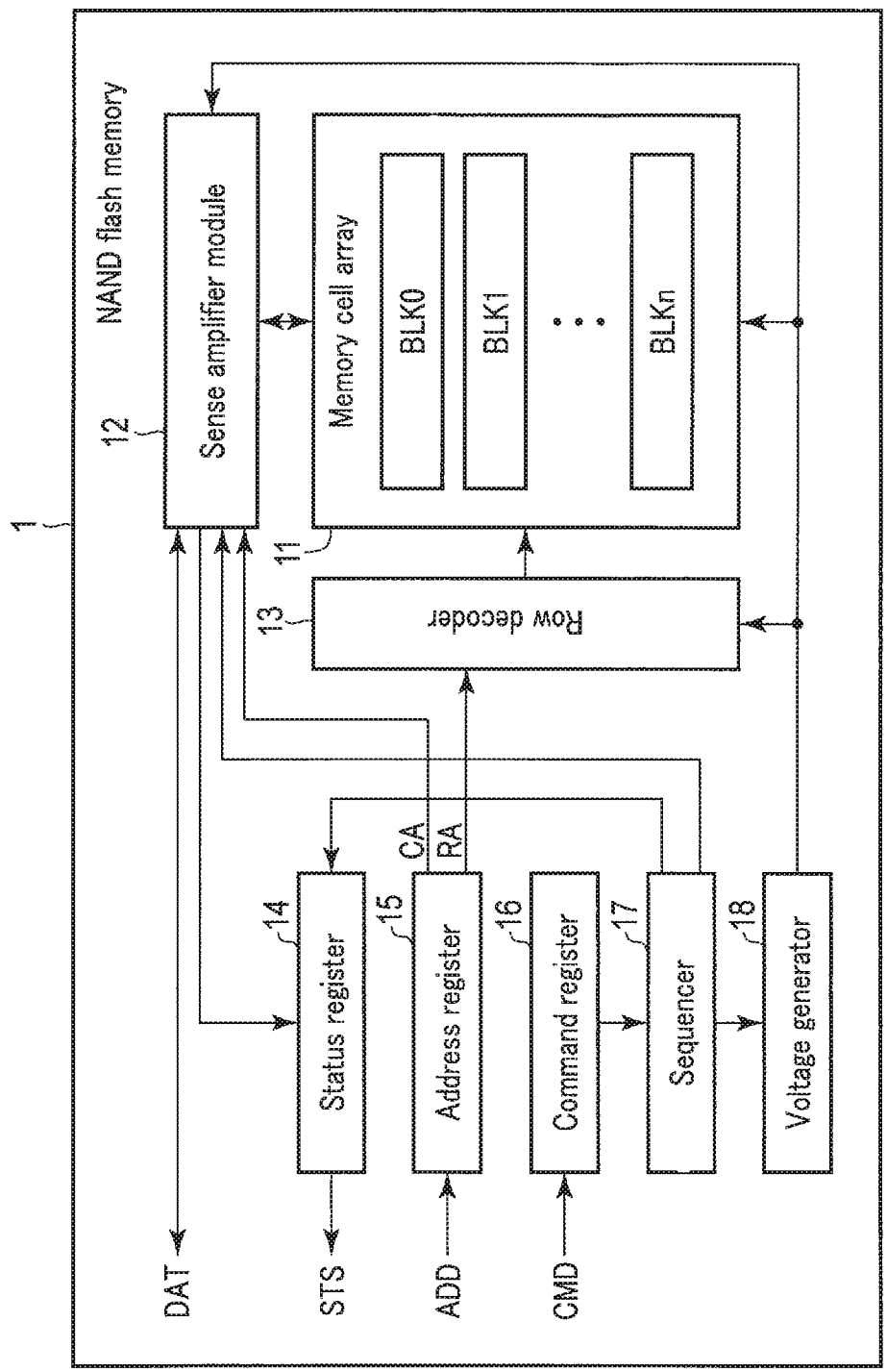
F I G. 1

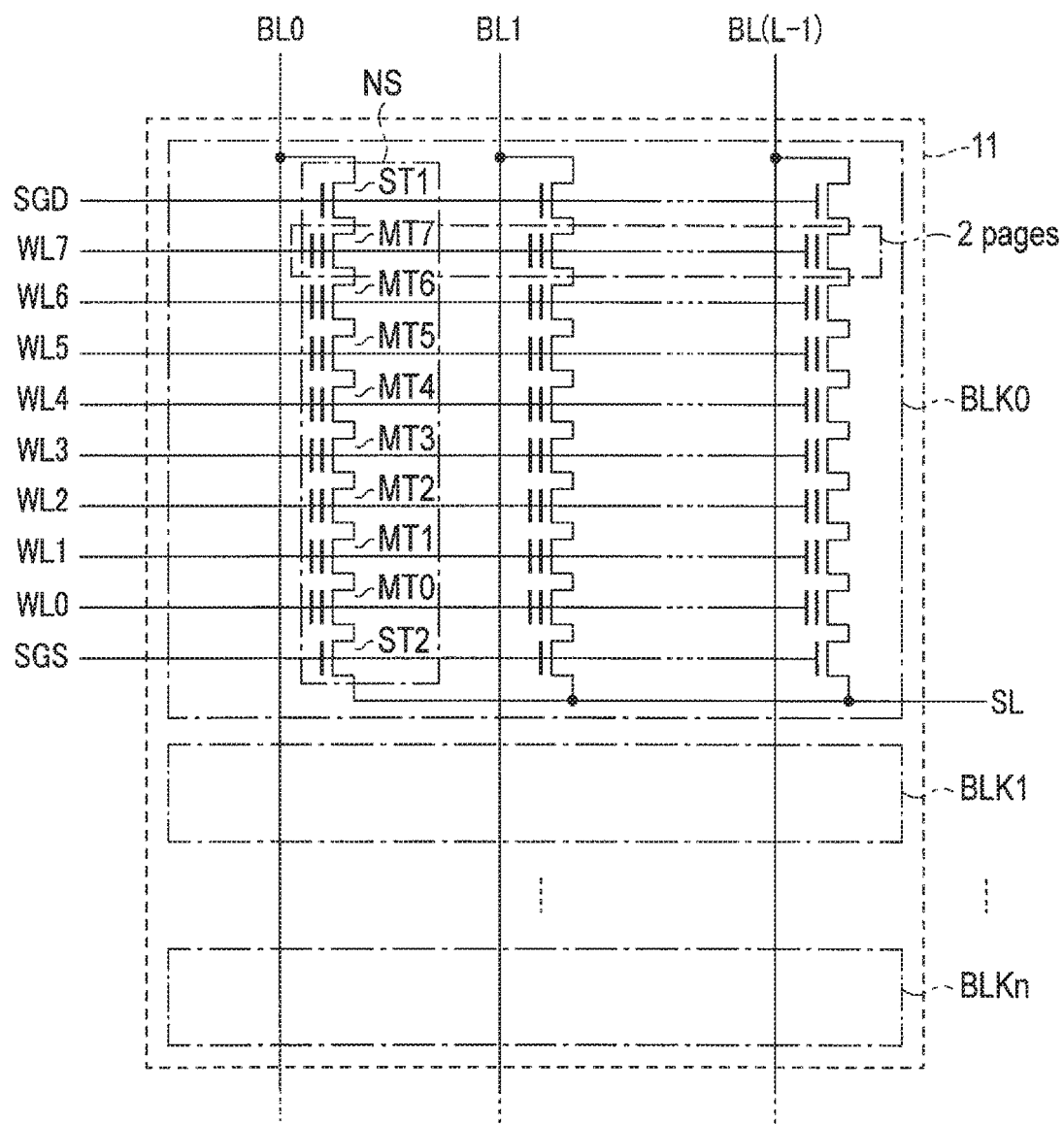
F I G. 2

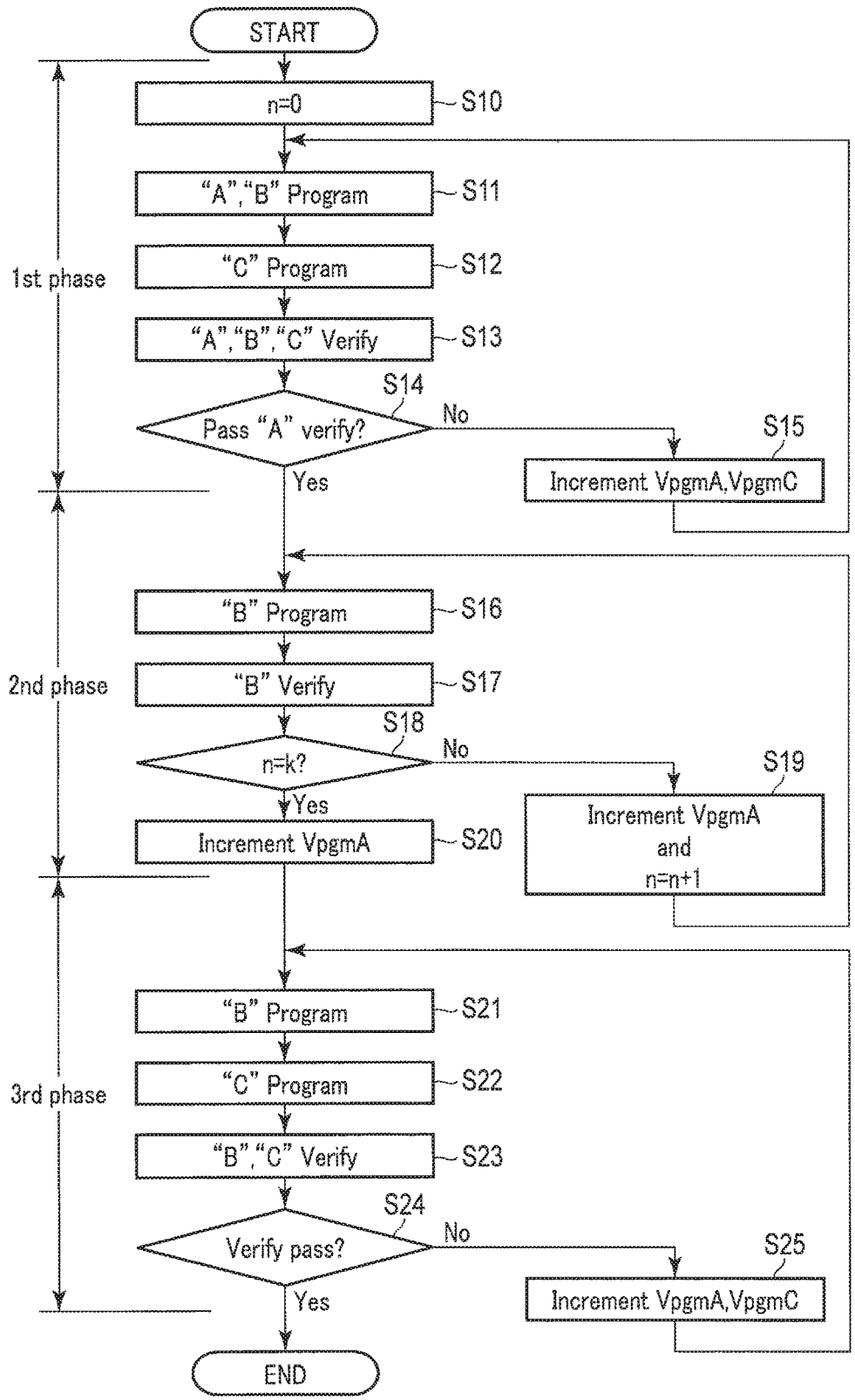
F I G. 5

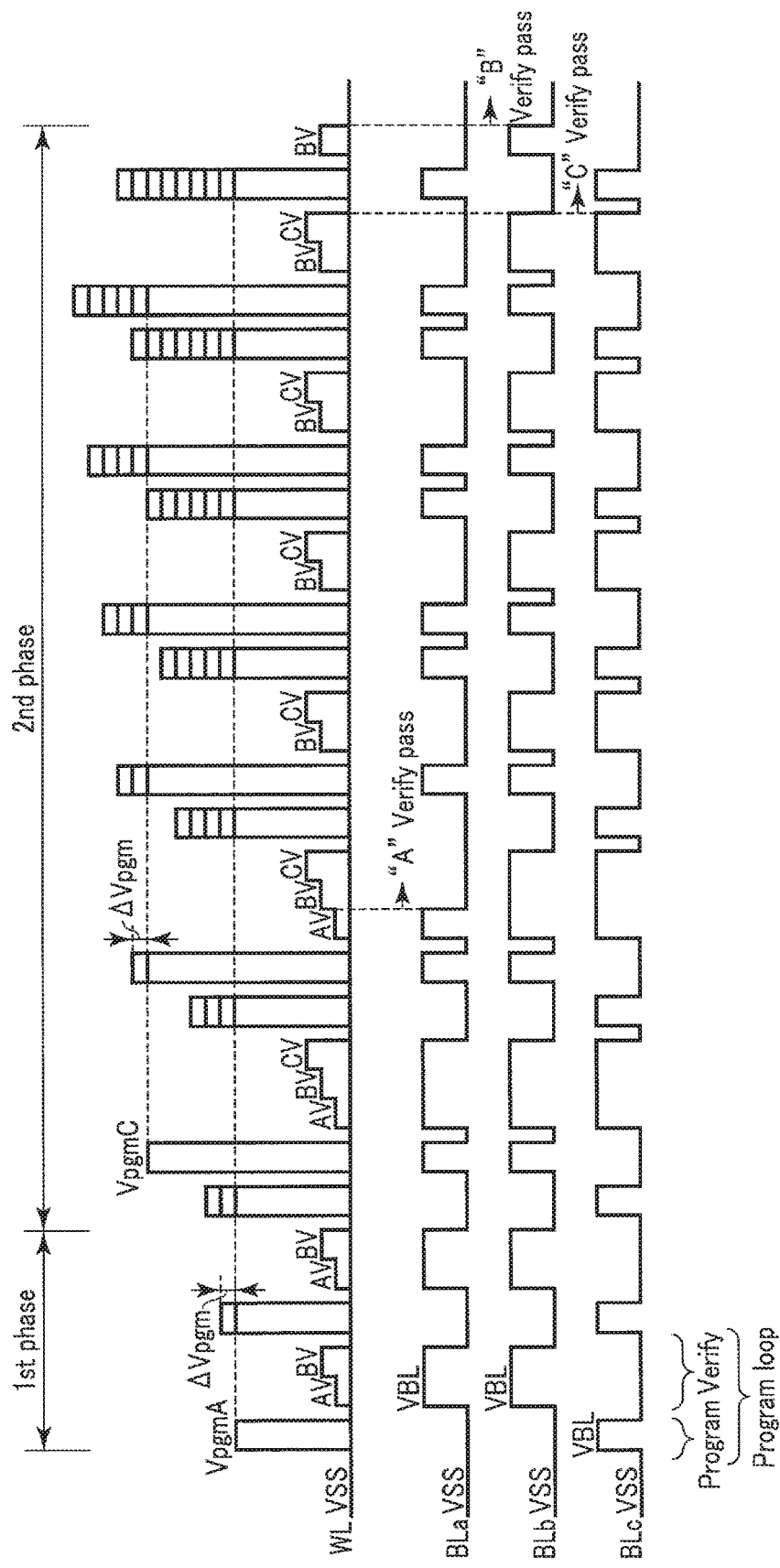
F I G. 8

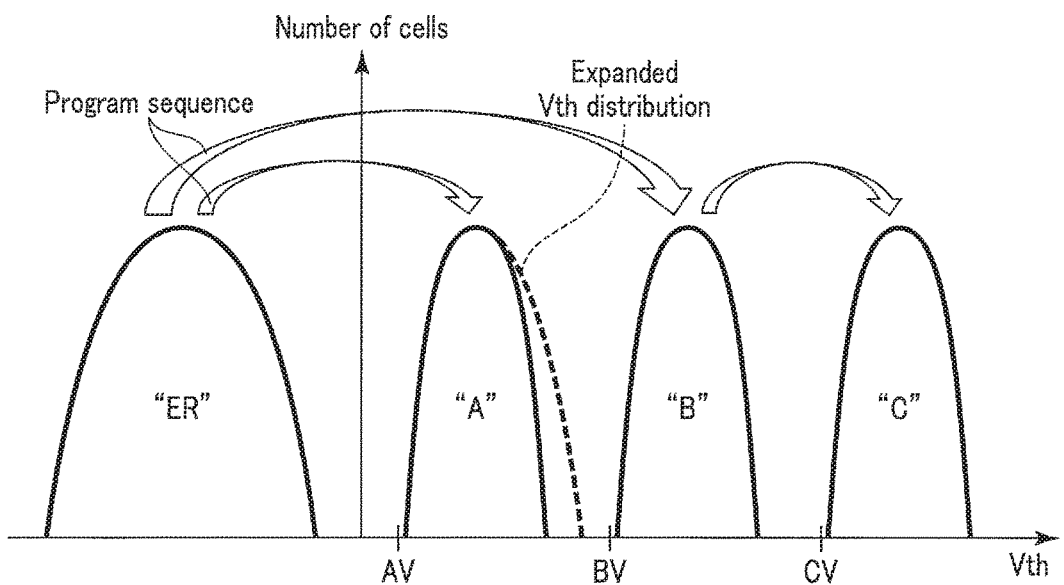
F I G. 14
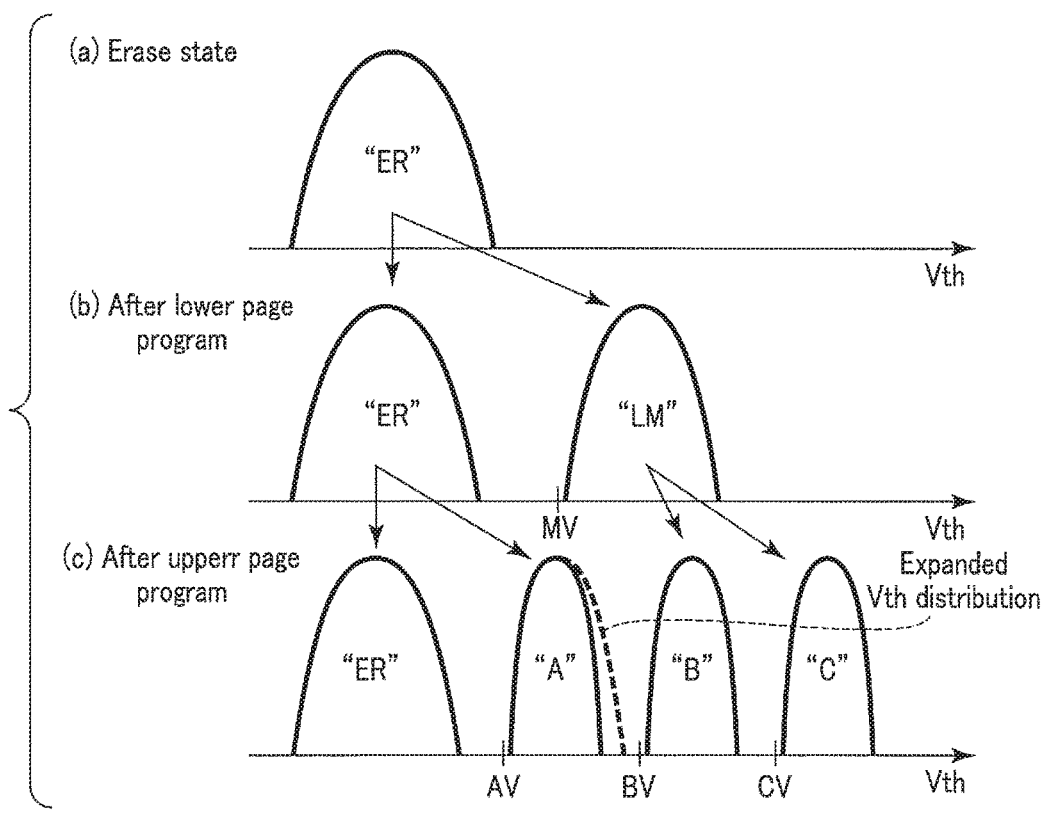
F I G. 15

SEMICONDUCTOR MEMORY DEVICE

CROSS-REFERENCE TO RELATED APPLICATIONS

This application is based upon and claims the benefit of priority from Japanese Patent Application No. 2016-049720, filed Mar. 14, 2016, the entire contents of which is incorporated herein by reference.

FIELD

Embodiments described herein relate generally to a semiconductor memory device.

BACKGROUND

There is known a semiconductor memory device in which a memory cell is used to store two or more bits of data.

BRIEF DESCRIPTION OF THE DRAWINGS

FIG. 1 is a block diagram of a semiconductor memory according to a first embodiment;

FIG. 2 is a circuit diagram of a memory cell array provided in the semiconductor memory device according to the first embodiment;

FIGS. 5, 6, 7, and 8 are flowcharts and waveform diagrams of the write operation in the semiconductor memory device according to the first embodiment;

FIG. 14 is a diagram for describing a threshold distribution caused by the write operation in the semiconductor memory device according to the second embodiment; and FIG. 15 is a diagram for describing a write operation in a semiconductor memory according to a third embodiment.

DETAILED DESCRIPTION

Figure 3:
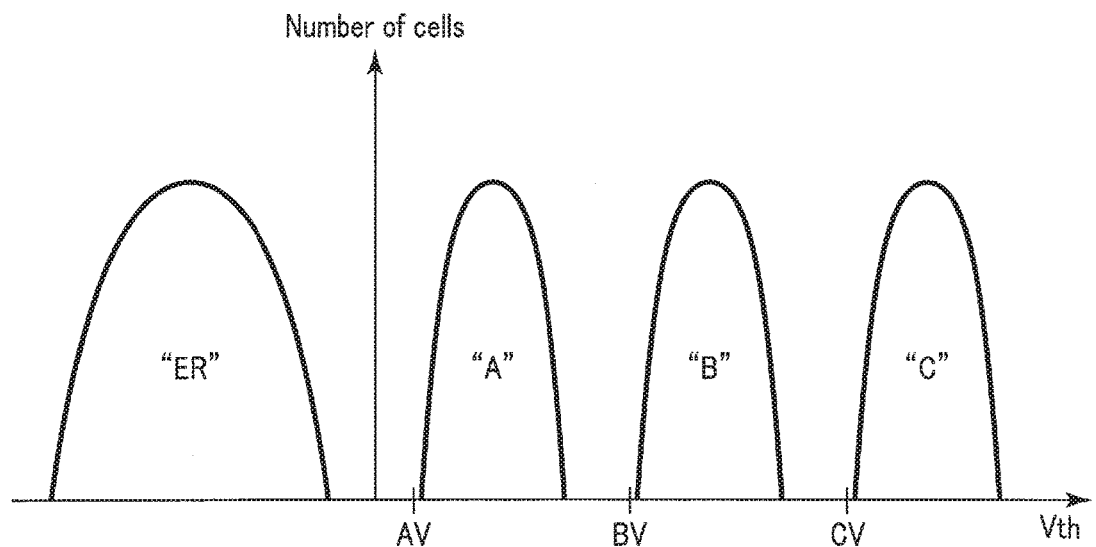
FIG. 3 is a graph illustrating a distribution of thresholds of the memory cells provided in the semiconductor memory according to the first embodiment.

In general, according to one embodiment, a semiconductor memory device includes a first memory cell and a word line. The first memory cell is capable of storing two or more bits of data. The word line is coupled with the first memory cell. a write operation repeat a program loop. The program loop includes a program operation and a verification operation. A program voltage is applied to the word line in the program operation. The write operation includes a first program loop and a second program loop subsequent to the first program loop. Program voltage is applied a first number of times in the first program loop. Program voltage is applied a second number of times in the second program loop. The second number of times is larger than the first number of times.

Hereinafter, embodiments will be described with reference to the drawings. Further, the components having the same functions and the same configurations in the following description will be attached with the common reference symbols.

[1] First Embodiment

In the following, a semiconductor memory device according to a first embodiment will be described.

[1-1] Configuration of Semiconductor Memory Device 1

First, a configuration of the semiconductor memory device 1 will be described using FIG. 1. A block diagram of the semiconductor memory device 1 is illustrated in FIG. 1. As illustrated in FIG. 1, the semiconductor memory device 1 includes a memory cell array 11, a sense amplifier module 12, a row decoder 13, a status register 14, an address register 15, a command register 16, a sequencer 17, and a voltage generator 18.

The memory cell array 11 includes blocks BLK0 to BLKn (n is a natural number of "1" or more). The block BLK is a set of nonvolatile memory cells associated to bit lines and word lines. For example, the block BLK serves as an erase unit of data. A Multi-Level Cell (MLC) method is applied to the memory cell to store two or more bits of data. The description in this embodiment will be made about an example in a case where two-bit data is stored in the memory cell.

The sense amplifier module 12 senses data DAT read out of the memory cell array 11, and outputs the read data DAT to an external controller as needed. In addition, the sense amplifier module 12 applies a voltage to the bit line on the basis of the written data DAT received from the controller.

The row decoder 13 selects a word line which corresponds to a target memory cell to be read and written. Then, the row decoder 13 applies a desired voltage respectively to the selected word line and a unselected word line.

The status register 14 stores status information STS of the semiconductor memory device 1.

The address register 15 stores address information ADD transmitted from the controller. Then, the address register 15 transmits a column address signal CA and a row address signal RA included in the status information ADD to the sense amplifier module 12 and the row decoder 13 respectively.

The command register 16 stores a command CMD transmitted from the controller. Then, the sequencer 17 executes variety of operation in accordance with the command CMD stored in the command register 16.

The sequencer 17 controls the entire operation of the semiconductor memory device 1. In addition, the sequencer 17 includes a counter. The counter is used at the time of the write operation, and counts the number of program loops to be described below.

The voltage generator 18 generates a voltage suitable to the memory cell array 11, the sense amplifier module 12, and the row decoder 13.

[1-1-1] Circuit Configuration of Memory Cell Array 11

Next, a circuit configuration of the memory cell array 11 will be described using FIG. 2. A circuit diagram of the memory cell array 11 is illustrated in FIG. 2. In the following, the description will be made about the circuit configuration using one block BLK. As illustrated in FIG. 2, the block BLK includes a plurality of NAND strings NS.

Each NAND string NS is provided to correspond to bit lines BL0 to BL(L−1) ((L−1) is a natural number of "1" or more). For example, each NAND string NS includes eight memory cell transistors MT (MT0 to MT7) and select transistors ST1 and ST2. Further, the number of memory cell transistors MT contained in one NAND string NS is not limited to the above configuration, and may be arbitrarily set.

The memory cell transistor MT includes a control gate and a charge storage layer, and stores data in a non-volatile manner. In addition, the memory cell transistors MT0 to MT7 are connected in series between the source of the select transistor ST1 and the drain of the select transistor ST2. The gates of the select transistors ST1 and ST2 in the same block each are commonly connected to select gate lines SGD and SGS. Similarly, the control gates of the memory cell transistors MT0 to MT7 in the same block each are commonly connected to word lines WL0 to WL7.

In addition, the drains of the select transistors ST1 of the NAND strings NS of the same column in the memory cell array 11 are commonly connected to the bit line BL. In other words, the bit line BL is commonly connected to the NAND strings NS of the same columns in the plurality of blocks BLK. Furthermore, the sources of the plurality of select transistors ST2 are commonly connected to a source line SL.

A set of one-bit data stored in the plurality of memory cells connected to the common word line WL will be referred to as "page" in the above configuration. Therefore, in a case where two-bit data is stored in one memory cell, two-page data is stored in a set of memory cells connected to one word line WL. In the two-page data, a set of upper bit data is referred to as an upper page, and a set of lower bit data is referred to as a lower page. With regard to "page", the "page" may be defined as a part of memory space formed by the memory cells connected to the same word line.

The writing and the reading of data may be executed for each page, or may be executed for each word line WL. A scheme for executing the writing and the reading of data for each page is called as a page-by-page reading/writing, and a scheme for executing the writing and the reading of data for each word line WL is called as a sequential reading/writing. For example, in a case where the two-bit data is stored in one memory cell, two-page data assigned to one word line WL is collectively written or read by executing a command one time.

[1-1-2] Threshold Distribution of Memory Cells

Next, the threshold distribution of the memory cells will be described using FIG. 3. FIG. 3 illustrates the threshold distribution of the memory cells which store two-bit data, and a voltage used in verification. The vertical axis and the horizontal axis of FIG. 3 correspond to the number of memory cells and a threshold voltage Vth.

As described above, the memory cell transistor MT stores data corresponding to the threshold voltage. For example, in a case where the memory cell transistor MT stores two-bit data, it can be seen that the threshold voltage is distributed into four parts as illustrated in FIG. 3. The two-bit data corresponding to four threshold distributions will be referred to as an "ER" level, an "A" level, a "B" level, and a "C" level in an ascending order of the threshold voltage. In addition, each verification voltages AV, BV, and CV illustrated in FIG. 3 are used for the verifications of the "A" level, the "B" level, and the "C" level at the time of writing. These voltage values satisfies a relation of AV<BV<CV.

The threshold voltage of the memory cell transistor MT storing the "ER" level is less than the voltage AV, and corresponds to an erase state of data. The threshold voltage of the memory cell transistor MT storing the "A" level is equal to or more than the voltage AV or less than the voltage BV. The threshold voltage of the memory cell transistor MT storing the "B" level is equal to or more than the voltage BV or less than the voltage CV. The threshold voltage of the memory cell transistor MT storing the "C" level is equal to or more than the voltage CV.

A voltage for reading data of the "A" level is set between a high skirt portion of the "ER" level and a low skirt portion of the "A" level. A voltage for reading data of the "B" level is set between a high skirt portion of the "A" level and a low skirt portion of the "B" level. A voltage for reading data of the "C" level is set between a high skirt portion of the "B" level and a low skirt portion of the "C" level.

[1-2] Write Operation

Next, the write operation in the semiconductor memory device 1 will be schematically described. In the write operation, there is repeatedly executed a program loop in which a program operation for varying the threshold voltage by injecting electrons into the charge storage layer and a verification operation for determining whether the threshold voltage varied by the program operation is at an appropriate level are combined, while stepping up a program voltage. In the program operation on the memory cell transistor MT of write complete or program inhibit, a variation in threshold voltage is suppressed, for example, by a self-boosting technique, and the verification operation is also not executed after the program operation.

In addition, in the write operation of this embodiment, the memory cell transistors MT connected to the same word line WL are divided into two groups on the basis of data to be written. For example, in a case where a sequential writing of 2-page data is executed, the memory cell transistors are grouped into a first group in which the "A" level or the "B" level having a low target threshold is written, and a second group in which the "C" level having a high target threshold is written.

In this case, in the single program operation, program voltages VpgmA and VpgmC are applied to the word line WL in this order. These voltages VpgmA and VpgmC are respectively corresponding to the first and second group. These voltages VpgmA and VpgmC are respectively optimized to the program operations of the "A" level and the "C" level, and satisfy a relation of VpgmA<VpgmC. When a program voltage corresponding to one group is applied, the memory cell transistor MT of the other group is set to be the program inhibit. Then, each memory cell transistor MT is subjected to the verification of the "A" level, the "B" level, and the "C" level after the program operation is executed.

In this way, in the write operation of this embodiment, in one program loop, the program operation of the first group having a low target threshold and the program operation of the second group having a high target threshold are progressed in parallel.

Figure 4:
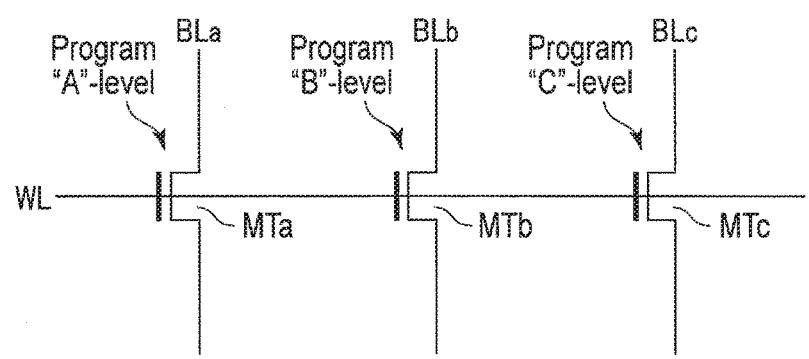
FIG. 4 is a diagram for describing a write operation in the semiconductor memory device according to the first embodiment.
Figure 6:
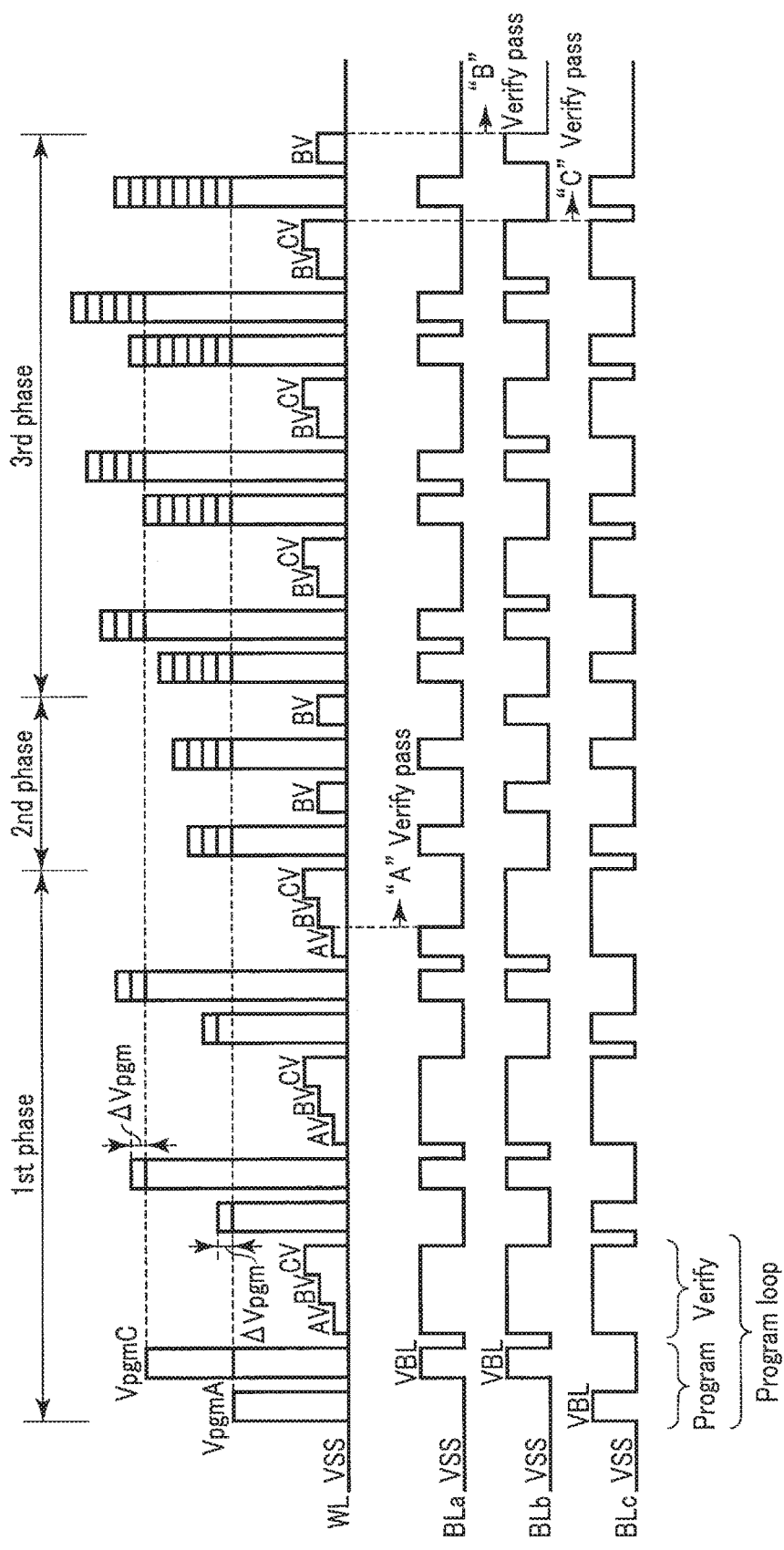

Next, the write operation of the semiconductor memory device 1 will be described in detail using FIGS. 4 to 6. FIG. 4 illustrates a definition for describing the write operation, FIG. 5 illustrates a flowchart of the write operation, and FIG. 6 illustrates a timing chart of an example of write operation.

As illustrated in FIG. 4, the following description will be made about an example in a case where three memory cell transistors MT (MTa, MTb, and MTc) connected to the same word line WL are written with different data from each other for the sake of simplicity in the description. In this example, the memory cell transistors MTa, MTb, and MTc are written with the "A" level, the "B" level, and the "C" level respectively. In addition, the bit lines BL connected to one ends of the memory cell transistors MTa, MTb, and MTc are called bit lines BLa, BLb, and BLc respectively.

As illustrated in FIG. 5, the write operation of this embodiment is divided into three phases. These phases include the program loop respectively. These phases are called first to third stages of the write operation in an order of execution. In the following, the operations of the respective phases will be described. Further, this embodiment will be assumed such that the writing of the "A" level is ended earlier than the writing of the "C" level.

First, a first phase of the write operation will be described. In the first phase, the program loop is executed until the writing of the "A" level is ended.

First, the sequencer 17 resets a counter (n=0, Step S10). The counter is used in the program loop of a second phase described below. In other words, the counter is reset at the beginning of the write operation in this embodiment, but the timing for resetting the counter is not limited thereto. The counter may be reset before the write operation proceeds to the second phase.

Next, the program operation is executed on the first group (Step S11). Specifically, the sense amplifier module 12 applies a voltage VSS to the bit lines BLa and BLb, and applies a voltage VBL to the bit line BLc as illustrated in FIG. 6. The voltage VSS is the ground voltage, and the voltage VBL is a power source voltage to be supplied from the sense amplifier module 12. When the voltage VBL is applied to the bit line BLc, the corresponding select transistor ST1 is cut off, and a channel of the memory cell transistor MTc goes into a floating state. Then, the row decoder 13 applies the voltage VpgmA to the word line WL. Then, the memory cell transistors MTa and MTb of the first group vary in the threshold voltage by a potential difference between the control gate and the channel. The memory cell transistors MTc of the second group are suppressed in threshold voltage by booting the channel voltage.

Next, the program operation with respect to the second group is executed (Step S12). The program operation is the same as a case where the voltages to be respectively applied to the bit lines BLa and BLb, the bit line BLc, and the word line WL are set to VBL, VSS, and VpgmC in the operation of Step S11. Then, the threshold voltage varies with respect to the memory cell transistor MTc of the second group, and the variation in threshold voltage is suppressed in the memory cell transistors MTa and MTb of the first group.

Next, the verification operation on the first and second groups is executed (Step S13). Specifically, the verification voltages AV, BV, and CV are applied to the word line WL in this order. It is confirmed whether the threshold voltages of the memory cell transistors MTa, MTb, and MTc are respectively equal to or more than the verification voltages AV, BV, and CV.

Next, the sequencer 17 confirms a verification result of the "A" level with respect to the memory cell transistor MTa (Step S14). Herein, in a case where the verification of the "A" level is failed (Step S14, No), the sequencer 17 increases the program voltages VpgmA and VpgmC by ΔVpgm (Step S15), and the procedure returns to the operation in Step S11. In other words, using the program voltages increased in Steps S15, the program operation and the verification operation of the "A" level, the "B" level, and the "C" level are executed again. Then, in a case where the verification of the "A" level is passed in Step S14 (Step S14, Yes), the procedure proceeds to the second phase of the write operation.

The above-described operation corresponds to the first phase of the write operation. The example illustrated in FIG. 6 shows a case where the verification of the "A" level in the first phase is passed at the third program loop.

Next, the second phase of the write operation will be described. The program operation and the verification operation are executed on the first group in the program loop in the second phase, and the program operation and the verification operation on the second group are skipped.

First, the program operation is executed on the first group (Step S16). Specifically, the sense amplifier module 12 applies the voltage VSS to the bit line BLb, and applies the voltage VBL to the bit line BLc as illustrated in FIG. 6. At this time, since the written memory cell transistor MTa comes into the program inhibit, the voltage VBL is applied to the bit line BLa. Then, the threshold voltage of the memory cell transistor MTb varies, and the threshold voltages of the memory cell transistors MTa and MTc are suppressed from varying.

Next, the verification operation is executed on the first group (Step S17). Specifically, the verification voltage VB is applied to the word line WL, and it is confirmed whether the threshold voltage of the memory cell transistor MTb becomes equal to or more than the verification voltage VB.

Next, the sequencer 17 confirms the execution number of times of the program operation and the verification operation corresponding to Steps S16 and S17 with reference to the counter (Step S18). Herein, in a case where the numerical value of the counter is less than k (k is a natural number of "1" or more) (Step S18, No), the sequencer 17 increases the program voltage VpgmA and the counter (Step S19), and the procedure returns to the operation of Step S16. In a case where the value of the counter in Step S18 is matched with k (Step S18, Yes), it means that the number of times of skipping the program operations and the verification operations with respect to the second group reaches a predetermined number. Then, the sequencer 17 increases the program voltage VpgmA (Step S20), the procedure proceeds to a third phase of the write operation.

The above-described operations correspond to the second phase of the write operation. The example illustrated in FIG. 6 shows a case where the number of times of skipping the program operations and the verification operations with respect to the second group in the second phase is "2". In other words, the example illustrated in FIG. 6 shows a case where the program operation and the verification operation with respect to the second group are skipped after the verification of the "A" level is passed, and the program operation and the verification operation with respect to the first group are repeatedly executed two times.

Next, the third phase of the write operation will be described. In the third phase, the program operation and the verification operation with respect to the second group are restarted, and the program loop is executed until the verifications of the "B" level and the "C" level are passed.

First, the program operation is executed on the first group (Step S21). The program operation is similar to that in Step S16. Next, the program operation is executed on the second group (Step S22). The program operation is similar to that in Step S16 except that the voltages applied to the bit line BLb, the bit line BLc, and the word line WL are set to VBL, VSS, and VpgmC respectively.

Next, the verification operation is executed on the first and second groups (Step S23). Specifically, the verification voltages BV and CV are applied to the word line WL, and it is confirmed whether the threshold voltages of the memory cell transistors MTb and MTc are equal to or more than BV and CV respectively.

Next, the sequencer 17 confirms verification results of the "B" level and the "C" level (Step S24). Herein, in a case where the verifications of the "B" level and the "C" level are failed (Step S24, No), the sequencer 17 increases the program voltages VpgmA and VpgmC (Step S25), and the procedure returns to the operation of Step S21. In other words, the program operation and the verification operation of the "B" level and the "C" level are executed again using the program voltage increased in Steps S25. In a case where the verifications of the "B" level and the "C" level are passed in Step S24 (Step S24, Yes), the semiconductor memory device 1 ends the write operation.

Further, in a case where the writing of one of the first and second groups is early ended in Step S24, the corresponding program voltage is increased in Step S25, and the program operation and the verification operation of the other group are executed in Steps S21 to S23.

The above-described operations correspond to the third phase of the write operation. The example illustrated in FIG. 6 shows the third phase in a case where the verification of the "C" level is passed in the third program loop, and the verification of the "B" level is passed in the fourth program loop.

As described above, in the write operations in which the program operation corresponding to two groups are executed in the single program loop, the write operation of this embodiment temporally skips the program operation and the verification operation of one group during the middle of the write operation.

Further, a timing for skipping the program operation and the verification operation of the one group may be set at the beginning of the write operation. It can be seen that the write operation is divided into two phases of the first and second phases. The first and second phases illustrated in FIG. 7 correspond respectively to the second phase and the first phase illustrated in FIG. 5.

Figure 7:
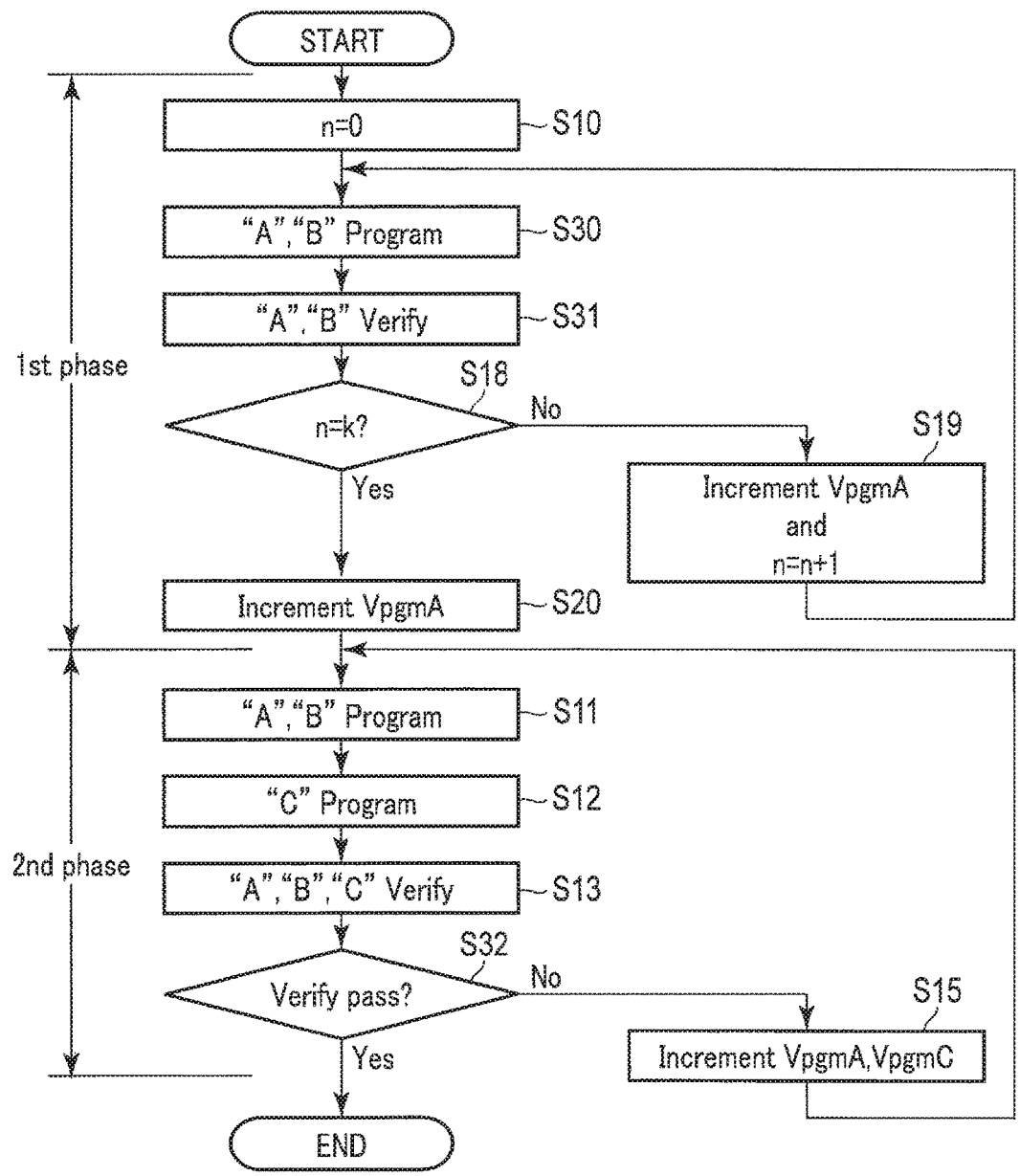

Specifically, Step S10 illustrated in FIG. 5 is first executed in the first phase illustrated in FIG. 7. Next, the program operation is executed on the first group (Step S30). In other words, the program operation and the verification operation are executed on the memory cell transistors MTa and MTb to which the "A" level and the "B" level are respectively written.

Next, the verification operation is executed on the first group (Step S31). In other words, the verification voltages AV and BV are sequentially applied to the word line WL, and it is confirmed whether the threshold voltages of the memory cell transistors MTa and MTb become equal to or more than AV and BV respectively.

Next, the procedure proceeds to Step S18. The subsequent operations are similar to those of the second phase illustrated in FIG. 5 except that the procedure proceeds to Step S30 after Step S19.

On the other hand, Steps S11 to S13 illustrated in FIG. 5 are first sequentially executed after Step S20 in the second phase illustrated in FIG. 7. In other words, the program operation and the verification operation with respect to the first and second groups are executed.

Next, the sequencer 17 confirms a verification result of each data (Step S32). Herein, in a case where there is a bit failed in the verification (Step S32, No), the sequencer 17 increases the corresponding program voltage Vpgm (Step S15), and the procedure returns to the operation of Step S1. In a case where all the verifications are passed in Step S32 (Step S32, Yes), the semiconductor memory device 1 ends the write operation.

An example of the write operation corresponding to the flowchart of FIG. 7 described above is a timing chart illustrated in FIG. 8. As illustrated in FIG. 8, the program operation and the verification operation are executed only on one group in the first phase of the write operation. Then, in the second phase, the program operation and the verification operation are executed on both groups, and the program operation and the verification operation are repeatedly executed until the writing of each data is ended.

[1-3] Effect of First Embodiment

Next, an effect of the first embodiment will be described. According to the semiconductor memory device 1 of the first embodiment, it is possible to improve reliability of data. In the following, the effect will be described in detail.

In a case where the semiconductor memory device executes the sequential writing, the writing may be executed by dividing the memory cell transistors MT connected to the same word line WL into a group having a low target threshold and a group having a high target threshold. Specifically, the semiconductor memory device applies the program voltage optimized to each group in the single program loop. One group is subjected to the writing while the other group is set to be the program inhibit. Therefore, the semiconductor memory device can apply a high program voltage to the group having a high target threshold from the beginning, so that the writing time can be shortened.

Figure 9:
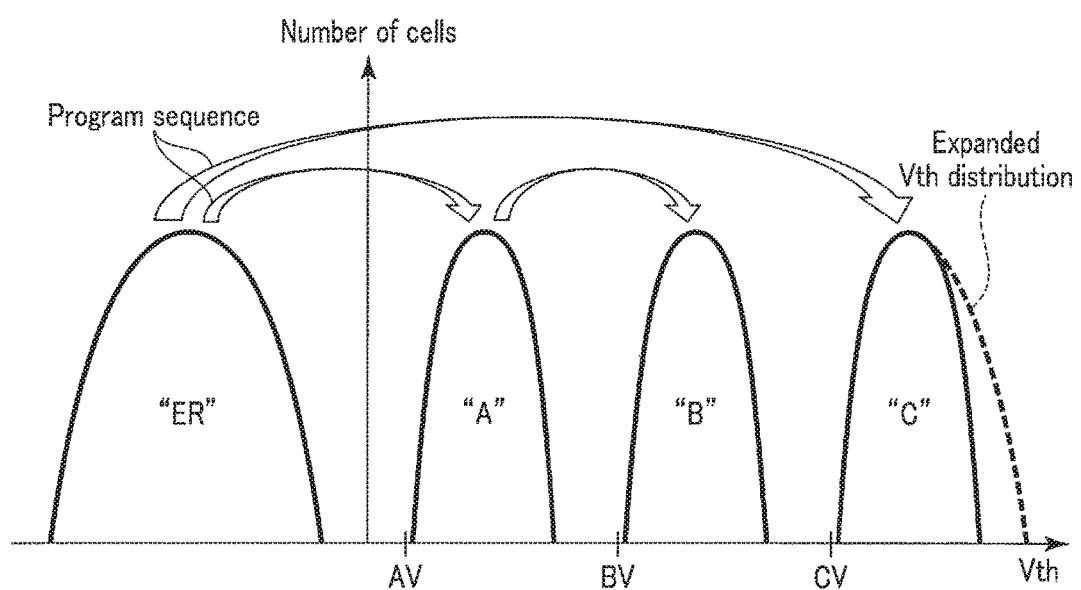
FIG. 9 is a diagram for describing a threshold distribution caused by the write operation in the semiconductor memory device according to the first embodiment.

However, when a timing for ending the writing of the group having a high target threshold is set to be early, the number of times of uselessly applying the program voltage to the group after the writing is ended may be increased. For example, as the threshold distribution illustrated in FIG. 9, the writing of the "A" level and the "C" level is ended first in a case where the memory cell transistors are divided into the first group in which the "A" level or the "B" level having a low target threshold is written, and the second group in which the "C" level having a high target threshold is written in the sequential writing of 2-page data. Then, a useless program voltage is applied to the memory cell transistor MT written with the "C" level during a period when the "B" level is written. In this way, the threshold voltage of the memory cell transistor MT to which the program voltage is applied after the writing is ended may vary as illustrated by a broken line of FIG. 9 even when the self-boosting technique is used.

Therefore, in the semiconductor memory device 1 according to this embodiment includes a period in which the program operation and the verification operation are skipped with respect to one group in such a write operation. Specifically, in the example illustrated in FIG. 9, there is provided a period in which the writing of the "C" level is skipped, for example, after the sequencer 17 ends the writing of the "A" level or at the beginning of the write operation. The period in which the writing is skipped is set by the number of times of the program loops for example. The number of times may be set to any numerical value.

Therefore, the semiconductor memory device 1 according to this embodiment can control timing for ending the writing of the group having a low target threshold and timing for ending the writing of the group having a high target threshold to be closer to each other. As a result, the semiconductor memory device 1 according to this embodiment can suppress, for example, the threshold voltage of the "C" level from being widened and can improve the reliability of the written data.

[2] Second Embodiment

Next, a semiconductor memory device according to a second embodiment will be described. In a case where the sequential writing of 2-page data is executed as described in the first embodiment, the first embodiment divides the memory cell transistors into the "A" and "B" levels and the "C" level. However, the second embodiment divides the memory cell transistors into the "A" level and the "B" and "C" levels. In the following, the description will be made about configurations different from the first embodiment.

[2-1] Write Operation

First, a write operation in the semiconductor memory device 1 will be schematically described. In this embodiment, in a case where the sequential writing of 2-page data is executed, the memory cell transistors MT are divided into a first group in which the "A" level having a low target threshold is written and a second group in which the "B" level and the "C" level having a high target threshold are written.

In this case, in the single program operation, program voltages VpgmA and VpgmB are applied to the word line WL in this order. These voltages VpgmA and VpgmB are respectively corresponding to the first and second group. The voltage VpgmB is optimized to the program operation of the "B" level, and satisfies a relation of VpgmA<VpgmB<VpgmC.

Figure 10:
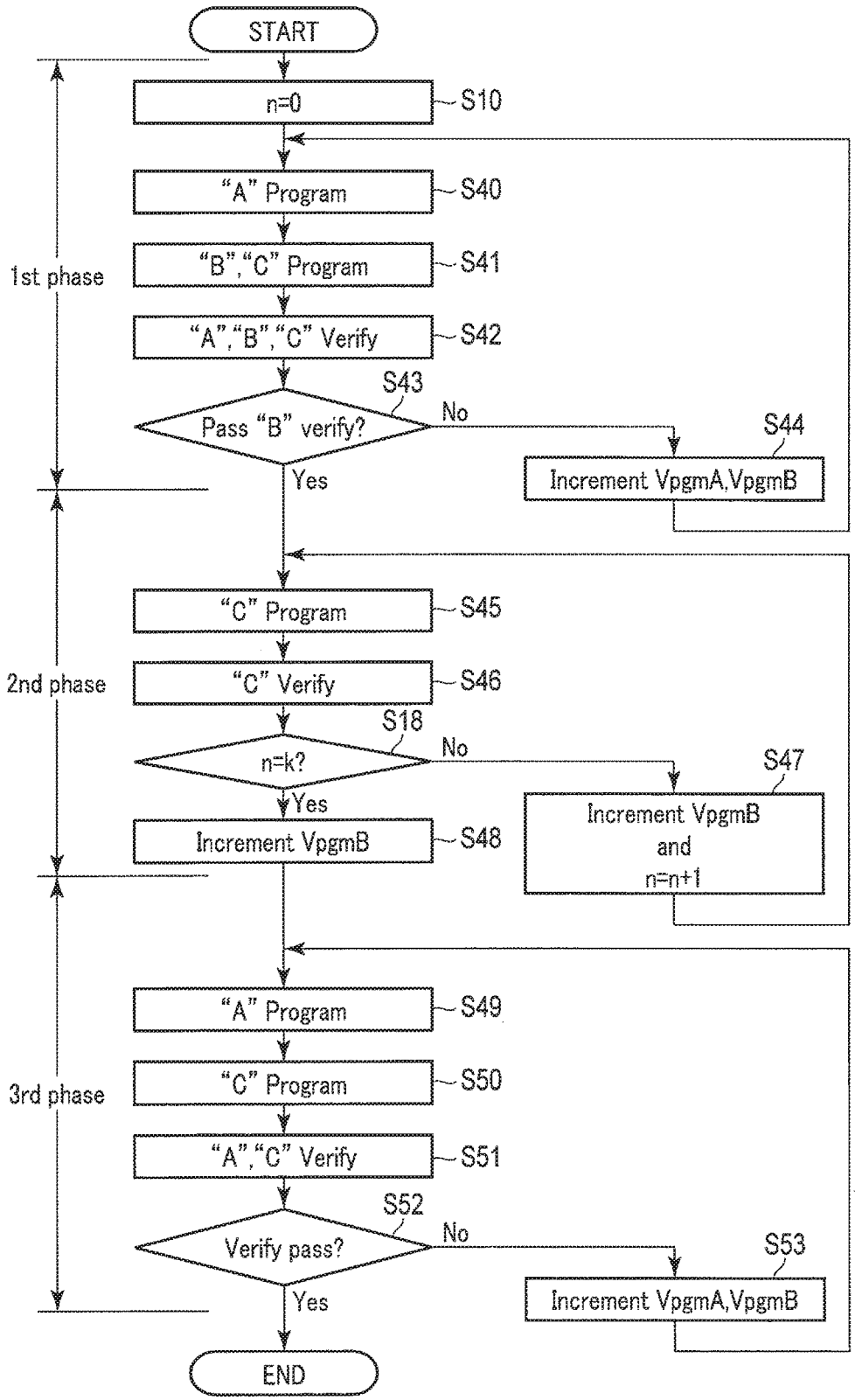
FIGS. 10, 11, 12, and 13 are flowcharts and waveform diagrams of a write operation in a semiconductor memory device according to a second embodiment.
Figure 11:
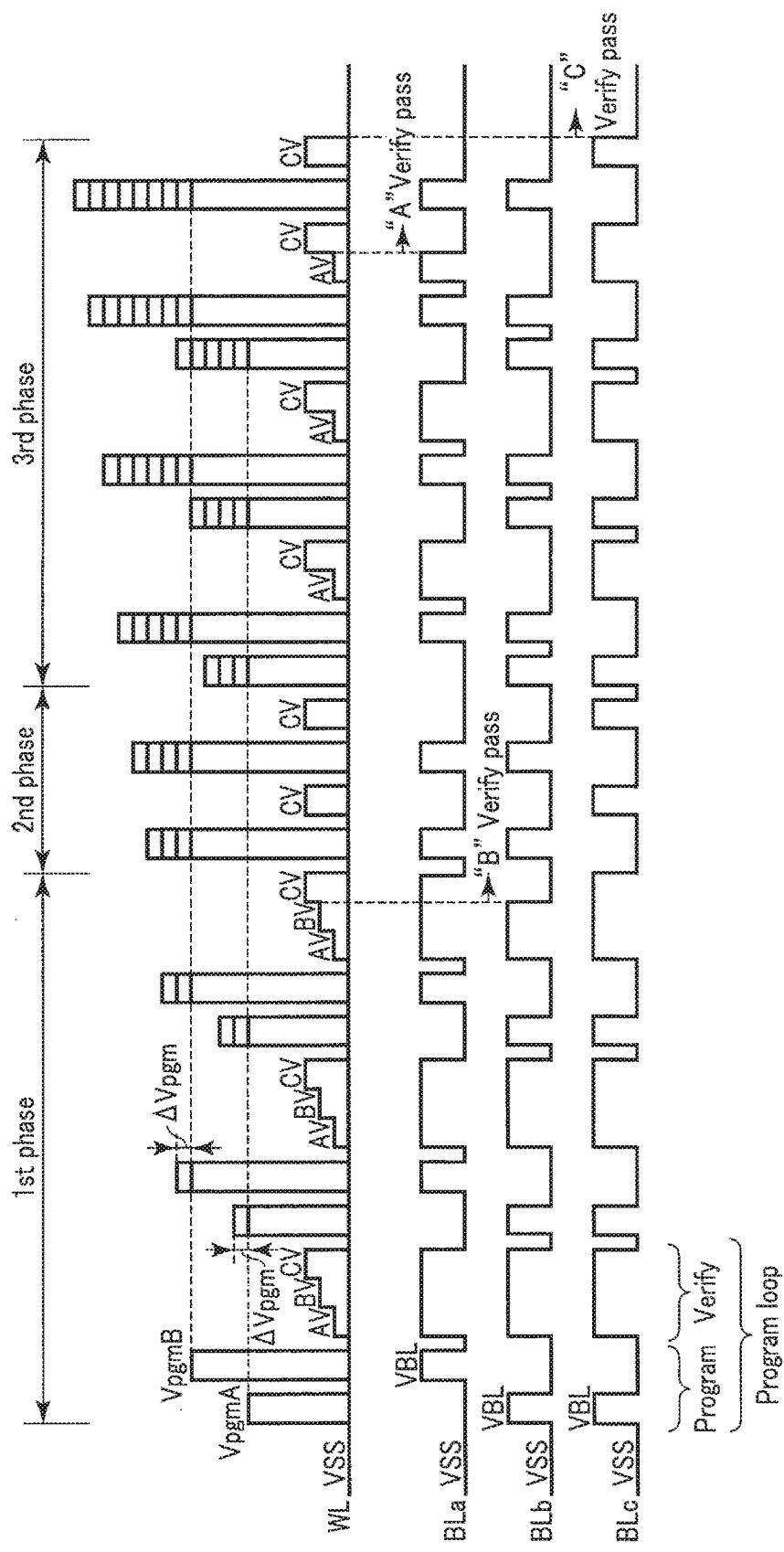

Next, the write operation of the semiconductor memory device 1 will be described in detail using FIGS. 10 and 11. FIG. 10 illustrates a flowchart of the write operation, and FIG. 11 illustrates a timing chart of an example of the write operation. A definition for describing the write operation is similar to that of FIG. 4 described in the first embodiment.

As illustrated in FIG. 10, in the write operation of this embodiment, the contents of the program operation and the verification operation to be executed are divided in accordance with the groups, and a group of which the program operation and the verification operation are skipped in the second phase is set as the first group in the flowchart described in FIG. 5. In the following, the first to third phases of the write operation will be simply described. Further, in this embodiment, the writing of the "B" level is assumed to be ended earlier than that of the "A" level.

First, in the first phase of the write operation, the sequencer 17 executes the program operation of the "A" level after Step S10 (Step S40). Subsequently, the program operations of the "B" level and the "C" level are executed (Step S41). Then, the sequencer 17 executes the verification on the "A" level, the "B" level, and the "C" level (Step S42), and confirms a verification result of the "B" level (Step S43). Herein, in a case where the verification of the "B" level is failed (Step S43, No), the sequencer 17 increases the program voltages VpgmA and VpgmB by ΔVpgm (Step S44), and the procedure returns to Step S40. In other words, the program operations and the verification operations of the "A" level, the "B" level, and the "C" level are executed again using the program voltage increased in Steps S44. In a case where the verification of the "B" level is passed in Step S42 (Step S43, Yes), the procedure proceeds to the second phase of the write operation. The example illustrated in FIG. 11 shows a case where the verification of the "B" level is passed in the third program loop in the first phase.

Next, in the second phase of the write operation, the sequencer 17 executes the program operation of the "C" level (Step S45), and subsequently executes the verification of the "C" level (Step S46). Then, in a case where the numerical value of the counter is less than k (k is a natural number of "1" or more) as a result of confirming the number of counted times in Step S18 (Step S18, No), the sequencer 17 increases the program voltage VpgmB and the counter (Step S47), and the procedure returns to the operation of Step S44. In a case where the value of the counter in Step S18 is matched with k (Step S18, Yes), the number of times of skipping the program operations and the verification operations with respect to the first group comes to reach a predetermined number of times. Then, the sequencer 17 increases the program voltage VpgmB (Step S48), and proceeds to the third phase of the write operation. The example illustrated in FIG. 11 shows a case where the number of times of skipping the program operations and the verification operations with respect to the first group is two times in this second phase.

Next, in the third phase of the write operation, the sequencer 17 executes the program operation of the "A" level (Step S49), and subsequently executes the program operation of the "C" level (Step S50). Then, the sequencer 17 executes the verification of the "A" level and the "C" level (Step S51), and confirms verification results of the "A" level and the "C" level (Step S52). Herein, in a case where the verification is failed (Step S52, No), the sequencer 17 increases the program voltages VpgmA and VpgmB (Step S53), and the procedure returns to the operation of Step S48. In a case where the verification is passed in Step S51 (Step S52, Yes), the semiconductor memory device 1 ends the write operation. The example illustrated in FIG. 11 shows a case where the verification of the "A" level is passed in the third program loop, and the verification of the "C" level is passed in the fourth program loop in the third phase. As described above, the write operation of this embodiment is executed.

Figure 12:
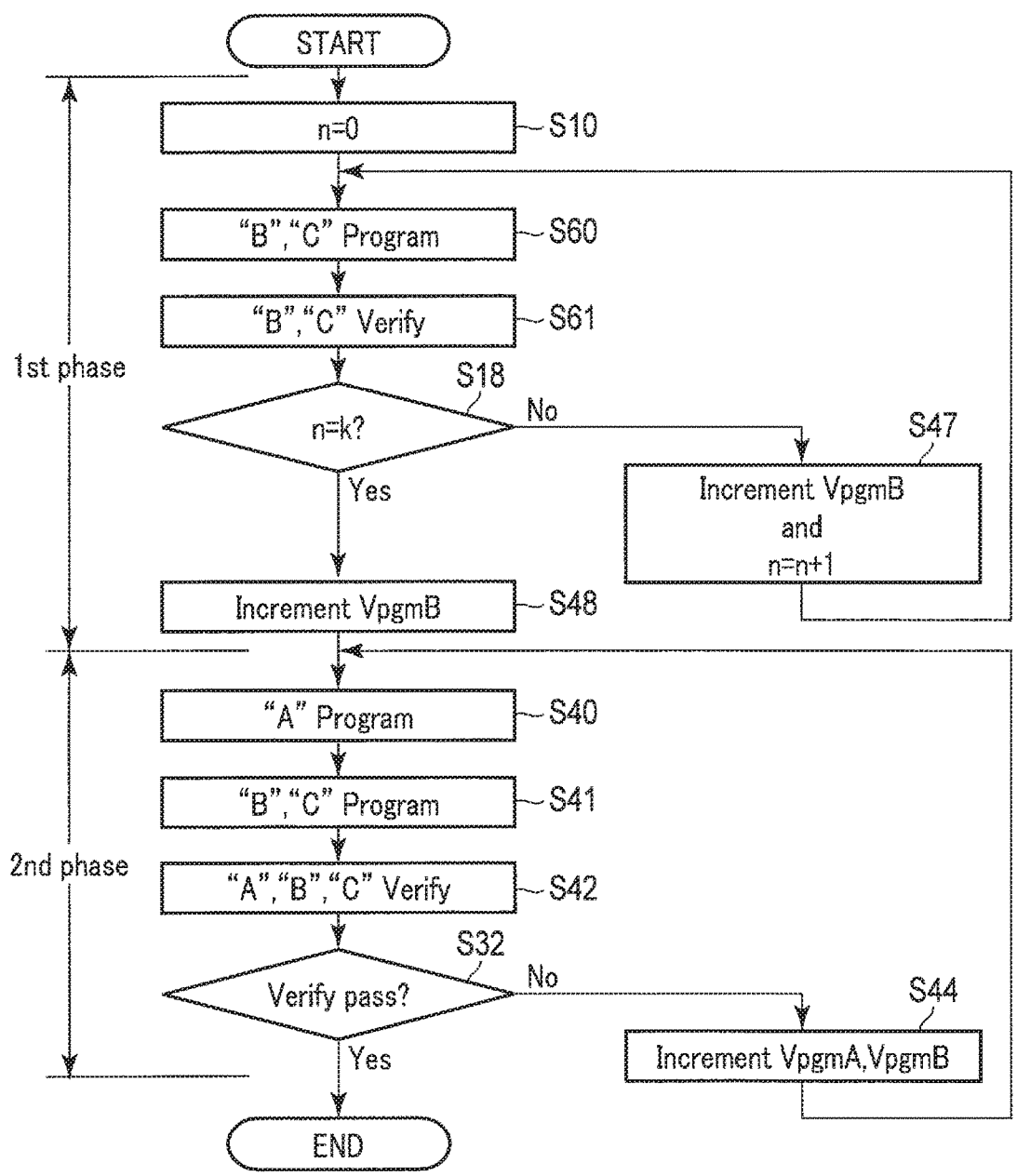

Further, similarly to the first embodiment, the timing for skipping the program operation and the verification operation of one group may be at the beginning of the write operation. In this case, a flowchart of the write operation becomes as illustrated in FIG. 12. It can be seen that the write operation is divided into two phases of the first and second phases. In the following, first and second phases of the write operation illustrated in FIG. 12 will be simply described.

First, the sequencer 17 executes the program operations of the "B" level and the "C" level after Step S10 in the first phase illustrated in FIG. 12 (Step S60), and subsequently executes the verification operations of the "B" level and the "C" level (Step S61). Then, the procedure proceeds to Step S18. The subsequent operations are similarly to those in the second phase illustrated in FIG. 12 except that the procedure proceeds to Step S60 after Step S48.

Next, the sequencer 17 executes the program operation and the verification operation of Steps S40 to S42 after Step S47 in the second phase illustrated in FIG. 12. Then, the sequencer 17 confirms a verification result (Step S32). Herein, in a case where the verification result contains a failed bit (Step S32, No), the sequencer 17 increases the corresponding program voltage Vpgm (Step S44), and the procedure returns to the operation of Step S40. In a case where all the verifications are passed in Step S32 (Step S32, Yes), the semiconductor memory device 1 ends the write operation.

Figure 13:
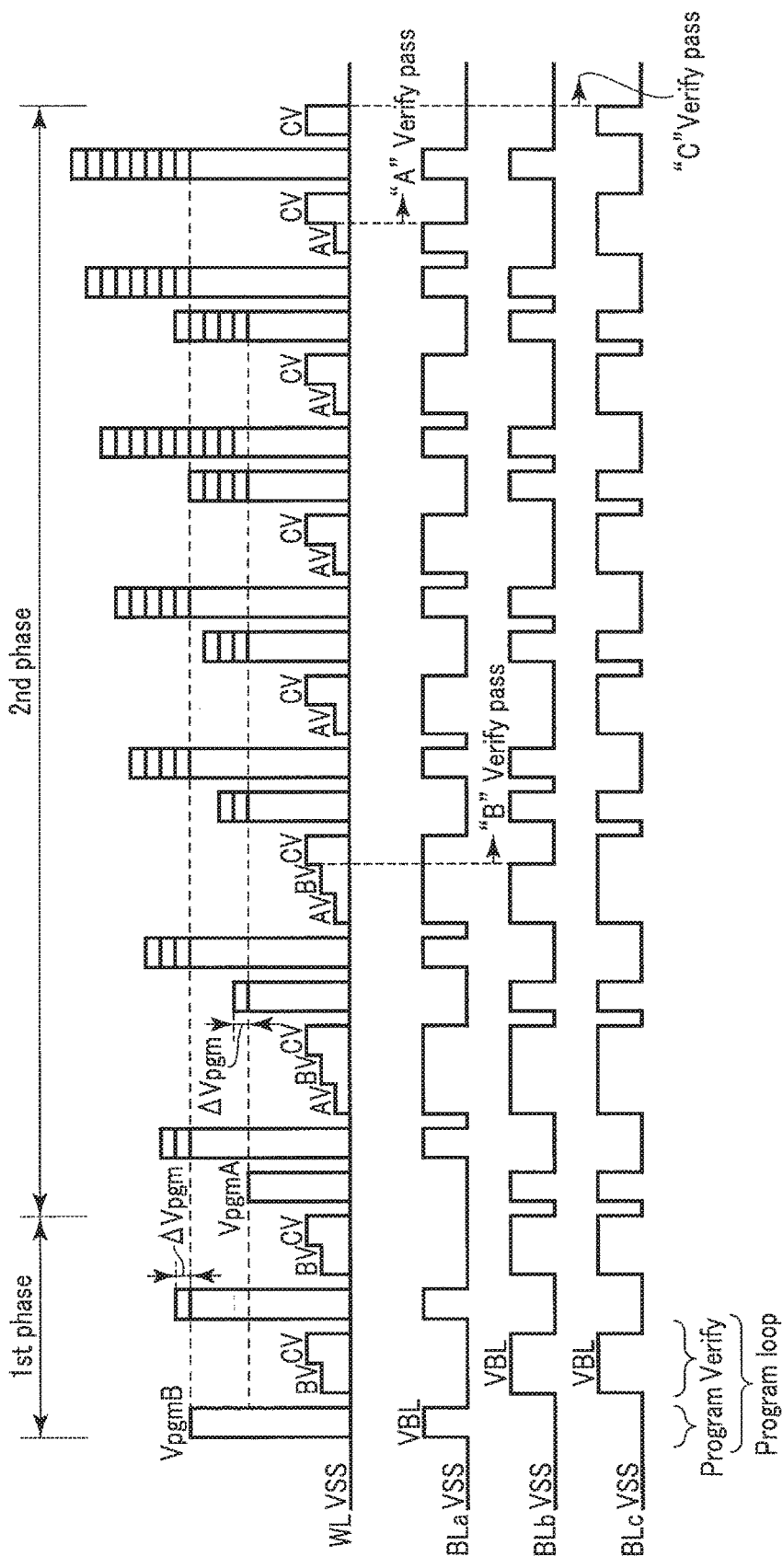

An example of the write operation corresponding to the flowchart of FIG. 12 described above is a timing chart illustrated in FIG. 13. The timing chart illustrated in FIG. 13 is similar to that in FIG. 8 described in the first embodiment except a condition of the supplied voltage.

[2-2] Effect of Second Embodiment

Next, an effect of the second embodiment will be described. According to the semiconductor memory device 1 of the second embodiment, it is possible to improve the reliability of data similarly to the first embodiment. In the following, the effect will be described in detail.

For example, as the threshold distribution illustrated in FIG. 14, the writing of the "A" level and the "B" level is ended first in a case where the memory cell transistors are divided into the first group in which the "A" level having a low target threshold is written, and the second group in which the "B" level and the "C" level having a high target threshold are written in the sequential writing of 2-page data. Then, the program voltage is uselessly applied to the memory cell transistor MT, to which the "A" level is written, during a period when the "C" level is written. In such a case, as described above, the threshold voltage of the memory cell transistor MT may vary as illustrated by a broken line of FIG. 14.

Therefore, the semiconductor memory device 1 according to this embodiment provides a period for skipping the program operation and the verification operation with respect to one group similarly to the first embodiment. Specifically, in the example illustrated in FIG. 14, the period for skipping the writing of the "A" level is provided after the sequencer 17 detects that the writing of the "B" level is ended, or at the beginning of the write operation for example.

Therefore, the semiconductor memory device 1 according to this embodiment can control timing for ending the writing of the group having a low target threshold and timing for ending the writing of the group having a high target threshold to be closer to each other. As a result, the semiconductor memory device 1 according to this embodiment can suppress, for example, the threshold voltage of the "A" level from being widened and can improve the reliability of the written data similarly to the first embodiment.

[3] Third Embodiment

Next, a semiconductor memory device according to a third embodiment will be described. In the third embodiment, the write operation of the second embodiment is applied to a case where the 2-page data is executed by page-by-page writing. In the following, the description will be made about configurations different from the first and second embodiments.

In the semiconductor memory device 1, the page-by-page writing of 2-page data is separately executed on a lower page writing and an upper page writing as illustrated in FIG. 15 for example.

First, as illustrated in (a) of FIG. 15, the write operation of the lower page is executed on the memory cell transistor MT of the "ER" level. Therefore, as illustrated in (b) of FIG. 15, the threshold distribution of the "ER" level is raised up to an "LM" (lower middle) level. The threshold voltage of the memory cell transistor storing the "LM" level is equal to or more than a voltage MV. The voltage MV is a voltage to be used in verification of the "LM" level. Further, a voltage for reading data of the "LM" level is set between a high skirt portion of the "ER" level and a low skirt portion of the "LM" level.

Next, the write operation of the upper page is executed on the memory cell transistors MT of the "ER" level and the "LM" level. Therefore, as illustrated in (c) of FIG. 15, the threshold distribution of the "ER" level is raised up to the "A" level, and the threshold distribution of the "LM" level is raised up to the "B" level or the "C" level.

In the semiconductor memory device 1 according to the third embodiment, the write operation of the second embodiment is applied to the page-by-page writing of 2-page data. Specifically, when the upper page is written, the memory cell transistors are divided into a first group in which the transistor is written from the "ER" level to the "A" level, and a second group in which the transistor is written from the "LM" level to the "B" or "C" level. Then, the program voltages corresponding to the "ER" level and the "LM" level are used in one program loop. The program operation of the first group having a low target threshold and the program operation of the second group having a high target threshold are progressed in parallel. Furthermore, a period for skipping the writing of the "A" level is provided in the write operation.

Therefore, the semiconductor memory device 1 according to this embodiment can control timing for ending the writing of the group having a low target threshold and timing for ending the writing of the group having a high target threshold to be closer to each other in the page-by-page writing similarly to the second embodiment. The semiconductor memory device 1 according to this embodiment can suppress, for example, the threshold voltage of the "A" level from being widened, and can improve the reliability of the written data similarly to the first and second embodiments.

[4] Modifications

The semiconductor memory device (1, FIG. 1) according to the embodiment includes a first memory cell (MT, FIG. 4) and a word line (WL, FIG. 4). The first memory cell is capable of storing two or more bits of data. The word line is coupled with the first memory cell. a write operation repeat a program loop. The program loop includes a program operation and a verification operation. A program voltage is applied to the word line in the program operation. The write operation includes a first program loop and a second program loop subsequent to the first program loop. The program voltage is applied a first number of times (one time, FIG. 6) in the first program loop. The program voltage is applied a second number of times (two times, FIG. 6) in the second program loop. The second number of times is larger than the first number of times.

Therefore, it is possible to provide the semiconductor memory device which can improve the reliability of data.

Further, the embodiment is not limited to the first to third embodiments, and can be changed in various forms. For example, the embodiment has been described about an example in a case where the memory cell is written with two-bit data, but not limited thereto. In other words, the first to third embodiments can be applied even in a case where the semiconductor memory device 1 writes three or more bits of data in the write operation where two types of program voltages are applied in one program loop. In this case, it is possible to suppress the widening of the threshold distribution of data which is finally written.

In addition, the above embodiment has been described about that the timing for skipping the program operation and the verification operation of a group starts at a timing when the writing of all the data is ended or immediately after the writing starts, but not limited thereto. For example, the program loop with respect to two groups is executed after the writing starts, and the number of times of the executed program loops is counted. Then, the sequencer 17 confirms whether the number of times reaches a certain number of times. Therefore, the program operation and the verification operation of a group can be skipped at an arbitrary timing.

In addition, an order of applying the two types of program voltages and an order of executing the verifications in the one program loop are not limited to the first to third embodiments. For example, in the write operation of the first embodiment, the voltage VpgmA may be applied after the voltage VpgmC is applied. In addition, in the program operation, a group having a high target threshold may be not set to the program inhibit when the program voltage of a group having a low target threshold is applied. In this case, a writing speed of the group having a high target threshold is slightly fast.

In addition, the above embodiment has been described about an example in a case where the verification voltage is increased in a step shape in the verification operation, but not limited thereto. For example, the verification voltage may be generated by continuously increasing the voltage. In this case, the verification voltage indicates a voltage value at a timing when the sense amplifier module 12 senses a voltage of the bit line BL. In addition, the number of times of applying the verification voltage corresponds to the number of times of sensing the voltage of the bit line BL at the time of the verification operation.

In addition, the above embodiment has been described about an example in a case where the verification operation is continuously executed with respect to the plurality of levels, but not limited thereto. For example, the verification may be separately executed on the respective levels. In addition, the description has been made about an example in a case where the order of applying the verification voltage is also an ascending order for the verification, but not limited thereto. The order may be switched.

In addition, the above embodiment has been described about that the number of times of skipping the program operation and the verification operation of a group becomes two or more times, but not limited thereto. The number of times of skipping may be only one cycle. In addition, the above embodiment has been described about that the counter for counting the number of times of skipping counts the number of times by increasing a numerical value, but not limited thereto. For example, the number of times of skipping may be counted by decreasing the numerical value of the counter. In this case, the counter is set to n=k instead of the reset operation of the counter described in Step S10 in the first embodiment for example. Then, the sequencer 17 determines whether n=0 in Step S18 of the second phase, and decreases the counter in Step S19. Therefore, similarly to a case where the counter is increased, the program operation and the verification operation of a group can be skipped by a desired number of times.

In addition, the above embodiment has been described about an example in a case where the verification is finally passed, but not limited thereto. For example, in a case where the verification is not passed after the program loop is executed a predetermined number of times, the writing itself of the page may be set to fail.

In addition, the expression "connection" in the above description means an electrical connection. A connection through a certain element is also included as well as a direct connection.

Further, the memory cell array 11 may be configured by three-dimensionally stacking the memory cell transistors MT on a semiconductor substrate.

A memory cell array formation may be disclosed in U.S. patent application Ser. No. 12/532,030 filed on Mar. 23, 2009. U.S. patent application Ser. No. 12/532,030, the entire contents of which are incorporated by reference herein.

Furthermore a memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore a memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore a memory cell array formation may be disclosed in U.S. patent application Ser. No. 12/407,403 filed on Mar. 19, 2009. U.S. patent application Ser. No. 12/407,403, the entire contents of which are incorporated by reference herein.

In addition, the block BLK may be not configured by the erase unit of data in the above embodiment.

An erase operation may be disclosed in U.S. patent application Ser. No. 13/235,389 filed on Sep. 18, 2011. U.S. patent application Ser. No. 13/235,389, the entire contents of which are incorporated by reference herein.

Furthermore an erase operation may be disclosed in U.S. patent application Ser. No. 12/694,690 filed on Jan. 27, 2010. U.S. patent application Ser. No. 12/694,690, the entire contents of which are incorporated by reference herein.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 μs to 38 μs, 38 μs to 70 μs, or 70 μs to 80 μs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising
a first memory cell capable of storing two or more bits of data, and
a word line coupled with the first memory cell, wherein
a write operation repeats a program loop, the program loop includes a program operation and a verification operation, a program pulse is applied to the word line in the program operation,
the write operation includes a first program loop and a second program loop subsequent to the first program loop,
the program pulse is applied a first number of times to the word line in the first program loop,
the program pulse is applied a second number of times to the word line in the second program loop,
the second number of times is larger than the first number of times.

2. The device of claim 1, wherein
in the first program loop,
a voltage applied first time as the program pulse is a first program voltage,
in the second program loop,
a voltage applied first time as the program pulse is a second program voltage,
a voltage applied second time as the program pulse is a third program voltage, and
the second program voltage is different from the third program voltage.

3. The device of claim 2, wherein
the third program voltage is higher than the second program voltage, and
the first program voltage is lower than the second program voltage.

4. The device of claim 3, further comprising:
a second memory cell coupled with the word line;
a first bit line coupled with the first memory cell; and
a second bit line coupled with the second memory cell, wherein
in the first program loop,
a first voltage is applied to the first bit line while the first program voltage is applied to the word line,
in the second program loop,
a second voltage is applied to the first bit line, and the first voltage is applied to the second bit line while the third program voltage is applied to the word line, and
the second voltage is higher than the first voltage.

5. The device of claim 2, wherein:
the third program voltage is higher than the second program voltage; and
the first program voltage between the second program voltage and the third program voltage.

6. The device of claim 5, further comprising:
a second memory cell coupled with the word line;
a first bit line coupled with the first memory cell; and
a second bit line coupled with the second memory cell, wherein
in the first program loop,
a first voltage is applied to the first bit line, a second voltage is applied to the second bit line while the first program voltage is applied to the word line,
in the second program loop,
the first voltage is applied to the second bit line while the second program voltage is applied to the word line,
the first voltage is applied to the first bit line while the third program voltage is applied to the word line, and
the second voltage is higher than the first voltage.

7. The device of claim 1, wherein
the write operation includes first and second phases, the first phase includes a plurality of the first program loop, the second phase includes the second program loop,
the write operation transitions from the first phase to the second phase in response to the program loop being carried out by the third number of times in the first phase.

8. The device of claim 1, wherein
a verification pulse is applied to the word line in the verification operation,
the verification pulse is applied a third number of times to the word line in the first program loop,
the verification pulse is applied a fourth number of times to the word line in the second program loop, and
the third number of times is larger than the fourth number of times.

9. The device of claim 1, wherein
the write operation includes a third program loop prior to the first program loop,
the program pulse is applied a third number of times to the word line in the third program loop, and
the third number of times is larger than the first number of times.

10. The device of claim 9, wherein:
in the first program loop,
a voltage applied first time as the program pulse is a first program voltage,
in the third program loop,
a voltage applied first time as the program pulse is a second program voltage,
a voltage applied second time as the program pulse is a third program voltage, and
the second program voltage is different from the third program voltage.

11. The device of claim 10, wherein:
the third program voltage is higher than the second program voltage,
the first program voltage is between the second program voltage and the third program voltage.

12. The device of claim 11, further comprising:
a second memory cell coupled with the word line;
a first bit line coupled with the first memory cell; and
a second bit line coupled with the second memory cell, wherein
in the third program loop,
a first voltage is applied to the first bit line while the second program voltage is applied to the word line,
a second voltage is applied to the first bit line, and the first voltage is applied to the second bit line while the third program voltage is applied to the word line, and
in the first program loop,
the first voltage is applied to the first bit line while the first program voltage is applied to the word line,
the second voltage is higher than the first voltage.

13. The device of claim 11, wherein
the write operation includes first and second phases, the first phase includes a plurality of the third program loop, the second phase includes the first program loop,
in the verification operation, first to third verification voltages are applied to the word line,
the first verification voltage is lower than the second verification voltage, the second verification voltage is lower than the third verification voltage,
the write operation transitions from the first phase to the second phase in response to the verification by the first verification voltage passed in the first phase.

14. The device of claim 10, wherein
the third program voltage is higher than the second program voltage,
the first program voltage is higher than the third program voltage.

15. The device of claim 14, further comprising:
a second memory cell coupled with the word line;
a first bit line coupled with the first memory cell; and
a second bit line coupled with the second memory cell, wherein
in the third program loop,
a first voltage is applied to the first bit line while the second program voltage is applied to the word line,
a second voltage is applied to the first bit line, and the first voltage is applied to the second bit line while the third program voltage is applied to the word line,
in the first program loop,
the second voltage is applied to the first bit line, and the first voltage is applied to the second bit line while the first program voltage is applied to the word line, and
the second voltage is higher than the first voltage.

16. The device of claim 14, wherein
the write operation includes first and second phases, the first phase includes a plurality of the third program loop, the second phase includes the first program loop,
in the verification operation, first to third verification voltages are applied to the word line,
the first verification voltage is lower than the second verification voltage, the second verification voltage is lower than the third verification voltage, and
the write operation transitions from the first phase to the second phase in response to the verification by the second verification voltage passed in the first phase.

17. The device of claim 14, wherein
the first memory cell is capable of storing two-bit data,
a writing of a lower bit to the first memory cell and a writing of a upper bit are executed separately, and
the write operation is applied to the writing of the upper bit to the first memory cell.

18. The device of claim 9, wherein
the write operation includes first and second phases, the first phase includes a plurality of the third program loop, the second phase includes the first program loop,
the write operation transitions from the first phase to the second phase in response to a fourth number of times execution of third program loop carried out in the first phase.

19. The device of claim 9, wherein:
a verification pulse is applied to the word line in the verification operation;
the verification pulse is applied a fourth number of times to the word line in the third program loop;
the verification pulse is applied a fifth number of times to the word line in the first program loop; and
the fifth number of times is lower than the fourth number of times.

20. The device of claim 1, wherein
the first memory cell is a memory storing not more than two-bit data.

* * * * *